United States Patent [19]

Koyama

[11] Patent Number: 5,047,712

[45] Date of Patent: Sep. 10, 1991

[54] CIRCUIT FOR INVERTING THE LATTER HALF OF PATTERN OUTPUT FROM DEVICE UNDER TEST

[75] Inventor: Jou Koyama, Tokyo, Japan

[73] Assignee: Ando Electric Co., Ltd., Tokyo, Japan

[21] Appl. No.: 571,961

[22] Filed: Aug. 23, 1990

[30] Foreign Application Priority Data

Aug. 31, 1989 [JP] Japan ................................. 1-226225

[51] Int. Cl.$^5$ ........................................... G01R 31/28
[52] U.S. Cl. ............................... 324/158 R; 371/22.4; 371/25.1
[58] Field of Search .......................... 324/158 R, 73.1; 371/22.4, 25.1, 27; 328/26

[56] References Cited

U.S. PATENT DOCUMENTS 4,551,837 11/1985 Goegelein et al. ................. 371/22.4
4,777,616 10/1988 Moore et al. ...................... 324/73.1

Primary Examiner—Ernest F. Karlsen
Attorney, Agent, or Firm—Panitch Schwarze Jacobs & Nadel

[57] ABSTRACT

A circuit for inverting the latter half of an expected signal representative of an output expected for a device to be tested with regard to operation thereof by a tester comprises a first flip-flop having a D-input terminal supplied with an inverting signal for controlling inversion of an expected pattern, a R-input terminal supplied with a reference clock signal for determining the period of the expected pattern and a C-input terminal supplied with a clock signal synchronized with transitions in an output pattern of a device to be tested as to whether it operates as desired or not, an exclusive-OR circuit having inputs supplied with the output of the first flip-flop and the expected pattern, respectively, an OR circuit having inputs supplied with the reference clock signal and the clock signal, respectively, and a second flip-flop having a D-input terminal supplied with the output of the exclusive-OR circuit and a C-input terminal supplied with the output of the OR circuit. Devices operating at higher operation cycles than that of the tester can be tested successfully.

2 Claims, 3 Drawing Sheets

CIRCUIT FOR INVERTING THE LATTER HALF OF PATTERN OUTPUT FROM DEVICE UNDER TEST

BACKGROUND OF THE INVENTION

1. Field of the Invention

The present invention generally relates to an apparatus for testing IC devices and more particularly to a circuit for inverting the latter half of an expected pattern signal output of a device which is tested by using an IC (integrated circuit) tester.

Among the devices tested by using IC testers, there exist those which output respective expected pattern signals which are inverted in the polarity or waveform for a duration corresponding to the latter half of the pattern. For making decision as to whether or not such type of device under test operates satisfactorily (i.e. whether the device passes the test or fails), it is indispensably required to invert the latter half portion of the expected output pattern of the device under test. The present invention is concerned with a circuit for inverting the latter half of the expected pattern output from the device of the type mentioned above.

2. Description of the Related Art

For having better understanding of the present invention, description will be made in some detail of a decision circuit known heretofore by reference to FIG. 3 of the accompanying drawings.

In FIG. 3, a reference numeral 5 denotes an exclusive-OR circuit (also referred to simply as EXOR), and 6 denotes a flip-flop circuit (also referred to simply as FF). A pattern signal 14 representing a pattern expected to be outputted from a device under test is applied to one input terminal of the EXOR 5 together with an actual output pattern of the device and applied to the other input of the EXOR 5, the output of which is then applied to a terminal D of the flip-flop circuit 6.

The flip-flop circuit 6 samples the output of the EXOR 5 with a decision strobe signal 16 applied to a terminal C, to thereby output a pass/fail signal indicating whether the actual output pattern coincides with the expected pattern, i.e. whether or not the device under test operates successfully or not. More specifically, the pass signal which may be of logic "0" is outputted from the flip-flop or FF 6 when coincidence is found between the expected pattern signal 11 and the actual output pattern signal. On the other hand, when discrepancy is detected between the expected pattern 11 and the output pattern 15, the flip-flop circuit 6 produces as the output the fail signal of logic "1".

Next, operation or function of the decision circuit shown in FIG. 3 will be elucidated by reference to a timing chart shown in FIG. 4 of the accompanying drawings. Referring to FIG. 4, there are shown a waveform of a reference clock signal 12 and that of the expected pattern signal 11 at (a) and (b), respectively. The reference clock signal 12 serves for determining the period of the expected pattern signal 11. Further, the output pattern signal 15 of the device under test may have such a waveform as shown at (c) in FIG. 4 with the strobe signal 16 having a waveform shown at (d) in the figure.

The expected pattern signal 11 and the actual output pattern signal 15 are applied to the inputs of the EXOR 5, as mentioned above, the output of which is latched by the flip-flop 6 with the strobe signal 16, whereby the pass/fail decision signal having such a waveform as shown at (e) in FIG. 4 is outputted from the flip-flop circuit 6. In the case of the illustrated example, the output signal of the flip-flop circuit 6 is shown to be of logic "0" at (f) in FIG. 4, indicating that the output pattern 15 coincides with the expected pattern 11. The period of the decision (i.e. periodical interval at which the decision is made as to whether the device under test passes or fails the test) is determined by the period $T_o$ of the reference clock signal. In other words, the decision-making is done every period or cycle of the reference clock signal. This is a limitation imposed because of the expected pattern 11 being latched and transmitted under the timing of the reference clock 12.

In conjunction with the strobe signal, there is known a double-strobe mode test in which the strobe signal 16 is generated twice at two descrete time points within one period $T_o$ of the reference clock signal 13, as can be seen from FIG. 4 at (g).

Now, let's assume that such a device is to be tested which produces an output signal inverted during the latter half of the expected pattern and which has a higher operation cycle than that of the tester. In that case, the tester will be set to the double strobe mode mentioned above, and it is expected that the result of "pass" is obtained, as shown in FIG. 4 at (e). However, since the expected pattern changes only on the one cycle basis, the result will be an alternate sequence in which "pass" and "fail" alternate with each other, as illustrated at (h) in FIG. 4. For this reason, it is impossible to test a device operating at a high frequency by the IC tester whose maximum operation frequency is lower than that of the device to be tested, to a great disadvantage.

SUMMARY OF THE INVENTION

It is therefore an object of the present invention to eliminate the shortcoming of the prior art tester apparatus mentioned above and provide a tester which is capable of testing even a device whose operation cycle or frequency is higher than that of the tester.

In view of the above and other objects which will be apparent as description proceeds, the present invention starts from the recognition that the device operating at a higher frequency than that of the tester can be tested successfully by changing the expected pattern at the same timing as the transitions in the output level of the device being tested by making use of the double strobe mode function.

Thus, according to a general aspect of the present invention, there is provided a circuit for inverting the latter half of an expected pattern which comprises a first flip-flop having a D-input terminal supplied with an inverting signal for controlling inversion of an expected pattern, a R-input terminal supplied with a reference clock signal for determining the period of the expected pattern and a C-input terminal supplied with a clock signal synchronized with transitions in an output pattern of a device which is to be tested with regard to whether it operates as desired or not, an exclusive-OR circuit having inputs supplied with the output of the first flip-flop and the expected pattern, respectively, an OR circuit having inputs supplied with the reference clock signal and the clock signal, respectively, and a second flip-flop having a D-input terminal supplied with the output of the exclusive-OR circuit and a C-input terminal supplied with the output of the OR circuit.

As mentioned above, according to the teachings of the invention, the inverting signal and the clock signal are additionally utilized. The inverting signal can change the expected pattern value for a given period or cycle on a real time basis. On the other hand, it is possible with the aid of the clock signal to change the expected pattern value at the same timing as the transitions in the output of the device under test. In this manner, even the device of higher operation cycle or frequency than that of the tester can be tested successfully.

The above and other objects, novel features and advantages of the present invention will become more apparent by reading the following description of a preferred embodiment thereof taken in conjunction with the accompanying drawings.

DESCRIPTION OF THE PREFERRED EMBODIMENTS

Now, the present invention will be described in detail in conjunction with a preferred or exemplary embodiment thereof by reference to the accompanying drawings.

Figure 1:
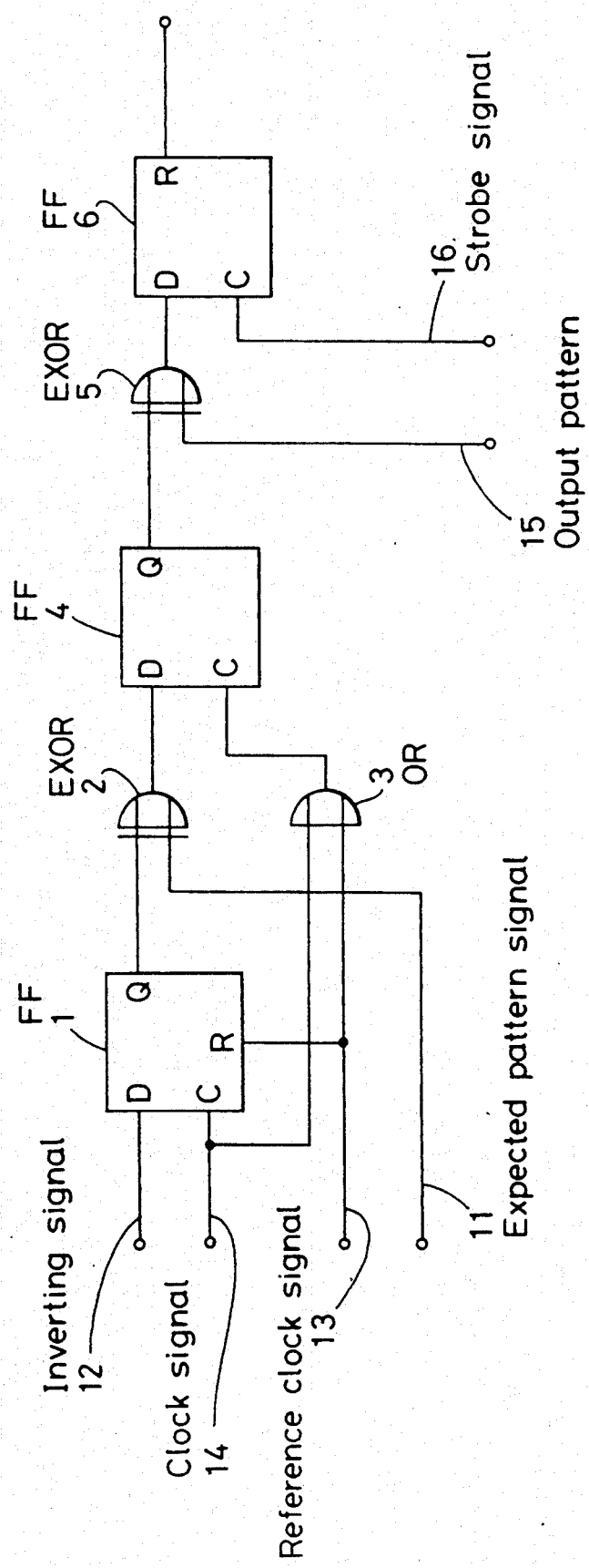
FIG. 1 is a schematic block diagram showing a configuration of the circuit for inverting the latter half of an expected pattern according to an exemplary embodiment of the present invention.

FIG. 1 shows a configuration of the circuit for inverting the latter half portion of an expected pattern. In the figure, a reference numeral denotes a flip-flop (FF) circuit, 2 denotes an exclusive-OR (EXOR) circuit, 3 denotes an OR circuit, and 4 denotes another flip-flop circuit. The other reference numerals same as those used in FIG. 3 denote same or like parts shown therein.

Figure 3:
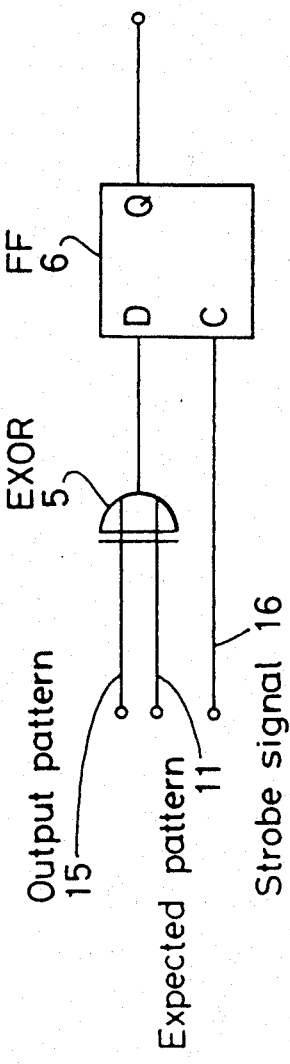
FIG. 3 is a circuit diagram showing schematically a configuration of the testing circuit known heretofore.

Referring to FIG. 1, the circuit for inverting the latter half of an expected pattern is constituted by the flip-flop 1, the exclusive-OR circuit 2, the OR circuit 3 and the flip-flop 4 which are to be added to the circuit shown in FIG. 3. An inverting signal 12 for controlling the inversion of an expected pattern 11 is inputted to a terminal D of the flip-flop circuit 1 which has a terminal R supplied with a reference clock signal for determining the period of the expected pattern 11. Further, the flip-flop 1 has a terminal C supplied with a clock signal 14 which is in synchronism with transitions in the output pattern of a device under test.

The exclusive-OR circuit 2 has two input terminals supplied with the output from the flip-flop 1 and the expected pattern 11, respectively. The OR circuit 3 is supplied at the inputs thereof with the reference clock signal 13 and the clock signal 14, respectively. The flip-flop 4 has a terminal D supplied with the output of the exclusive-OR circuit 2 and a terminal C supplied with the output of the OR circuit 3.

Operation of the circuit shown in FIG. 1 will be explained below by reference to FIG. 2.

Figure 2:
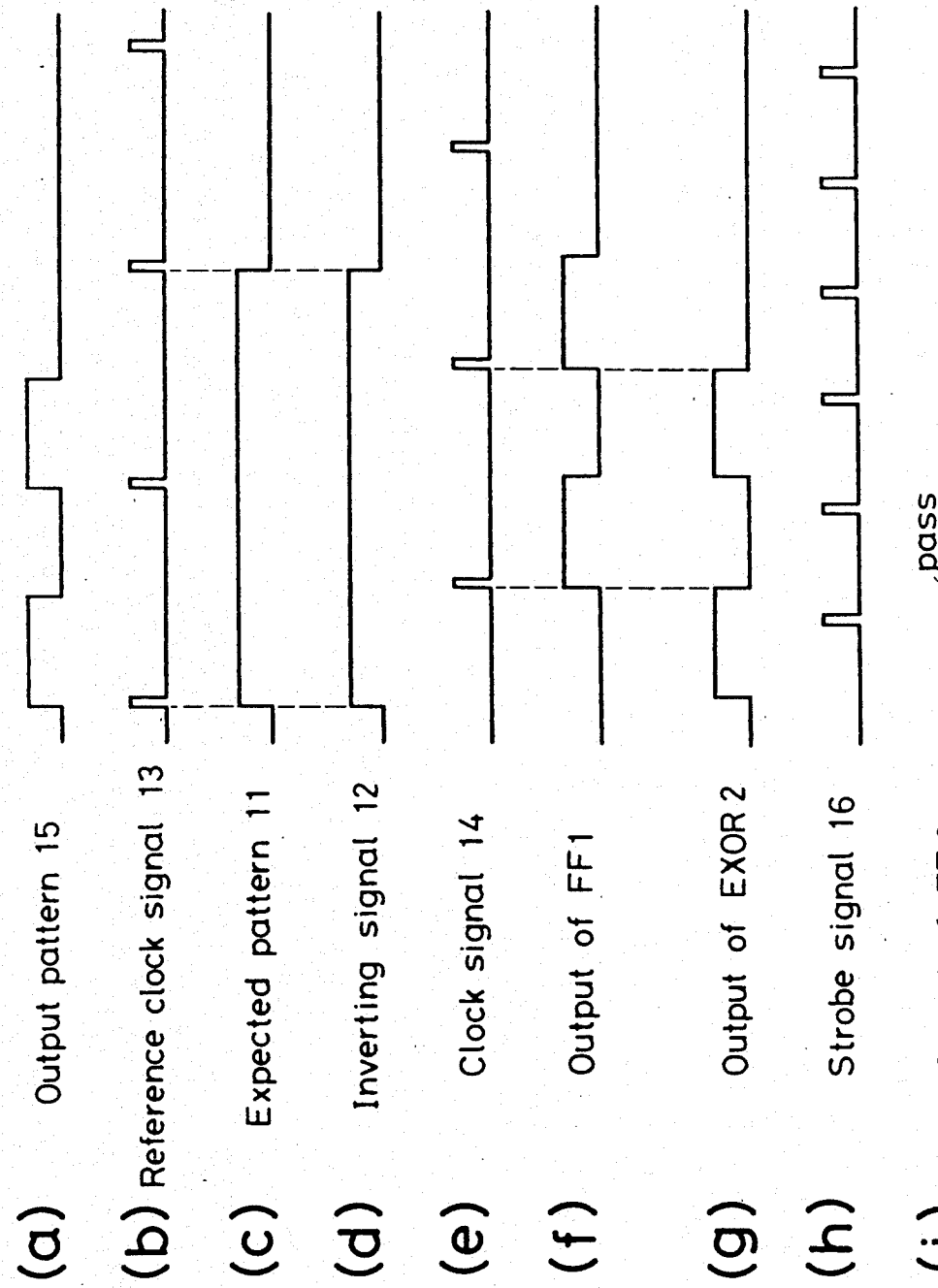
FIG. 2 is a timing chart for illustrating operation of the circuit shown in FIG. 1.

Shown in FIG. 2 at (a) is a waveform of an output pattern signal 15 produced by a device under test. As can be seen from this waveform diagram, the output of this device is inverted in the latter half period of the expected pattern 11. The reference clock signal 13 has a waveform such as shown in FIG. 2 at (b) and serves for determining the period of the expected pattern 11 whose waveform is shown at (c) in FIG. 2. The inverting signal has such a waveform as shown at (d) in FIG. 2 and serves for controlling the inversion of the expected pattern 11. Shown at (e) in FIG. 2 is a waveform of the clock signal 14, while that of the output of the flip-flop circuit 1 is shown at (f) in the same figure. The clock signal 14 is synchronized with the transitions in the output pattern 15 of the device under test. The output of the flip-flop 1 is also synchronized with the clock signal 14, as can be seen from FIG. 2.

Further referring to FIG. 2, waveform of the output of the exclusive-OR circuit 2 is shown at (g), and that of the strobe signal 16 is shown at (h). Inputted to the exclusive-OR circuit 2 are the waveforms shown at (c) and (f), respectively. The flip-flop 4 has the inputs supplied with the outputs of the exclusive-OR circuit 2 and the OR circuit 3, respectively. At this juncture, it should be noted that the output of the flip-flop 4 assumes the same waveform as the output of the exclusive-OR circuit 2 shown at (g) in FIG. 2.

Figure 4:
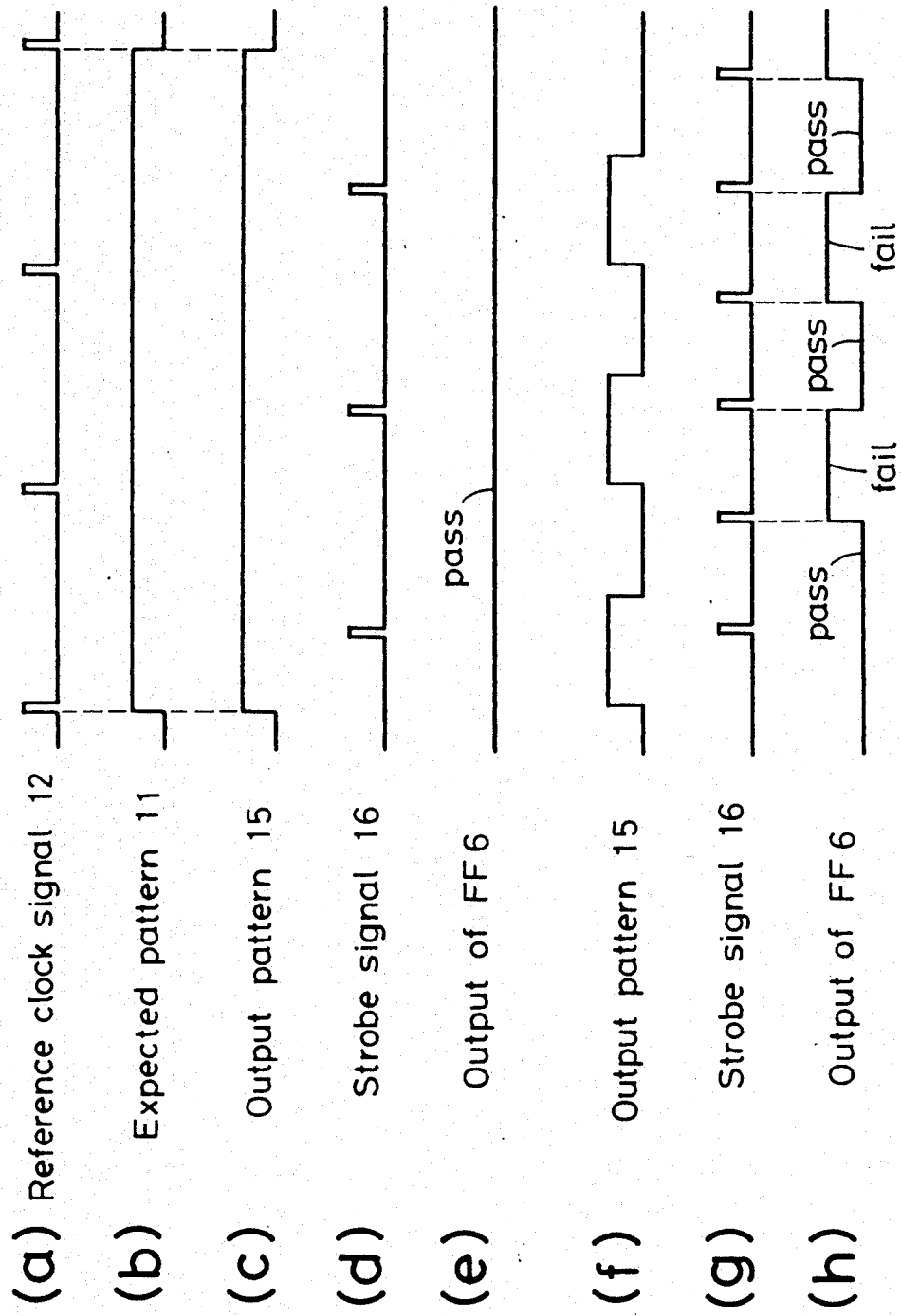
FIG. 4 is a timing chart for illustrating operation of the circuit shown in FIG. 3.

Finally, shown at (i) in FIG. 2 is a same signal as that shown in FIG. 4(c) except for the difference from the latter in that alternative appearance of the pass and fail levels in the waveform shown in FIG. 4(c) is replaced by the pass level only for the waveform shown at (i) in FIG. 2.

As will be appreciated from the foregoing description, it is possible to test satisfactorily those devices which operate at higher rates than the normal by providing additionally at the upstream side of the prior art circuit shown in FIG. 3 the circuit for inverting the latter half of the expected pattern which circuit is constituted by the first flip-flop 1, the exclusive-OR 2, the OR circuit 3 and the second flip-flop 4.

It is thought that the present invention and many of its attendant advantages will be understood from the foregoing description and it will be apparent that various changes may be made in the form, construction and arrangement thereof without departing from the spirit and scope of the invention or sacrificing all of its material advantages, the form hereinbefore described being merely a preferred or exemplary embodiment thereof.

What is claimed is:

1. A circuit for inverting the latter half of an expected pattern for a device to be tested with regard to operation thereof, comprising:

a first flip-flop having a first input terminal supplied with an inverting signal for controlling inversion of an expected pattern, a second input terminal supplied with a reference clock signal for determining the period of said expected pattern and a third input terminal supplied with a clock signal synchronized with transitions in an output pattern of a device to be tested as to whether it operates as desired or not;

an exclusive-OR circuit having inputs supplied with the output of said first flip-flop and said expected pattern, respectively;

an OR circuit having inputs supplied with said reference clock signal and said clock signal, respectively; and a second flip-flop having a first input terminal supplied with the output of said exclusive-OR circuit and a third input terminal supplied with the output of said OR circuit.

2. An apparatus for testing an electric/electronic device, comprising:

a first flip-flop having a first input terminal supplied with an inverting signal for controlling inversion of an expected pattern, a second input terminal supplied with a reference clock signal for determining the period of said expected pattern and a third input terminal supplied with a clock signal synchronized with transitions in an output pattern of a device to be tested as to whether it operates as desired or not;

a first exclusive-OR circuit having inputs supplied with the output of said first flip-flop and said expected pattern, respectively;

an OR circuit having inputs supplied with said reference clock signal and said clock signal, respectively;

a second exclusive-OR circuit having an inputs supplied with the output of said second flip-flop and an output pattern produced by said device under test, respectively; and a third flip-flop having inputs (first, third) supplied with the output of said second exclusive-OR circuit and a strobe signal, respectively, and an output terminal for producing a signal indicating whether said device under test operates satisfactorily or not.

* * * * *